(12) United States Patent
Sato et al.

(10) Patent No.: US 7,314,264 B2
(45) Date of Patent: Jan. 1, 2008

(54) INK JET APPLICATION DEVICE AND INK JET APPLICATION METHOD

(75) Inventors: Tsuyoshi Sato, Yokohama (JP);
Yukihisa Hasegawa, Yokohama (JP);
Atsushi Kinase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 298 days.

(21) Appl. No.: 11/186,890

(22) Filed: Jul. 22, 2005

(65) Prior Publication Data

US 2006/0187253 A1    Aug. 24, 2006

(30) Foreign Application Priority Data

Jul. 23, 2004    (JP)    ............... P2004-216106

(51) Int. Cl.
*B41J 29/393*    (2006.01)
(52) U.S. Cl. ...................................... 347/19
(58) Field of Classification Search ............... 347/19, 347/5, 9, 148, 59
See application file for complete search history.

(56) References Cited

U.S. PATENT DOCUMENTS 5,945,853 A * 8/1999 Sano .............. 327/87
5,990,738 A * 11/1999 Wright et al. ............ 330/149
2003/0222934 A1* 12/2003 Choi et al. .................. 347/19
2006/0187253 A1   8/2006 Sato et al.
2007/0076040 A1*  4/2007 Shang et al. ............... 347/19

FOREIGN PATENT DOCUMENTS

JP    10-138509    5/1998

OTHER PUBLICATIONS

U.S. Appl. No. 11/535,319, filed Sep. 26, 2006, Ooshiro, et al.
U.S. Appl. No. 11/535,314, filed Sep. 26, 2006, Kinase, et al.

* cited by examiner

*Primary Examiner*—Lamson D. Nguyen
(74) *Attorney, Agent, or Firm*—Oblon, Spivak, McClelland, Maier & Neustadt, P.C.

(57) ABSTRACT

An ink jet application method employed in an ink jet application device so as to apply a certain voltage to an actuator mounted to a nozzle and spray an ink-droplet from the nozzle by a uniform volume, including reading characteristic information for relating a volume of the ink-droplet to a voltage value to be applied to the actuator; calculating a voltage value related to the volume of the ink-droplet sprayed from the nozzle which is a voltage correcting object with reference to the characteristic information; calculating a voltage difference value between the calculated voltage value and a voltage value related to a specific voltage to the voltage difference value to the actuator mounted to the nozzle which is the voltage correcting object.

4 Claims, 6 Drawing Sheets

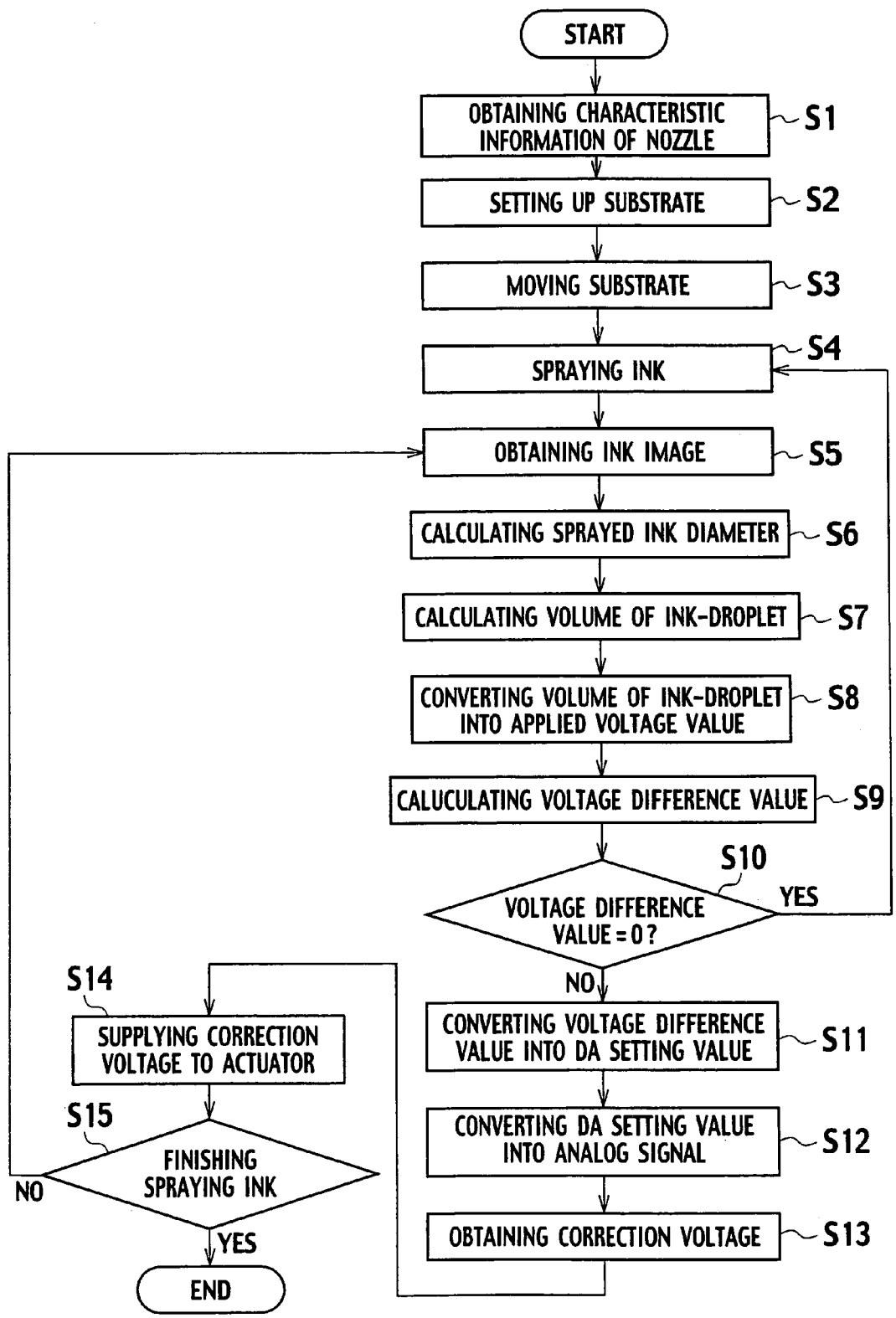

US 7,314,264 B2

INK JET APPLICATION DEVICE AND INK JET APPLICATION METHOD

BACKGROUND OF THE INVENTION

1. Field of the Invention

The present invention relates to an ink jet application device and an ink jet application method for spaying ink-droplets on a substrate.

2. Description of the Related Art

Recently, a demand for a flat display increases with the development of a personal computer (PC), a portable phone, etc. A liquid crystal display, an organic EL (electro-luminescence) display, etc. are employed as the flat display. In a process for manufacturing the flat display, a luminescent layer material (ink) is applied on a surface of a substrate by an application head mounted in an ink jet application device.

As shown in FIG. 1, an application head 101 comprises nozzles 103a, 103b, 103c, ink chambers 105a, 105b, 105c, a channel unit 107, a diaphragm 109 and actuators 111a, 111b, 111c. The ink chambers 105a, 105b, 105c are communicated with the nozzles 103a, 103b, 103c, respectively. The channel unit 107 accommodates the ink chambers 105a, 105b, 105c. The diaphragm 109 closes open ends of the ink chambers 105a, 105b, 105c. The actuators 111a, 111b, 111c are disposed at the open end sides of the ink chambers 105a, 105b, 105c, respectively.

When voltages are applied to the actuators 111a, 111b, 111c, the actuators 111a, 111b, 111c are deformed to vary volumes of the ink chambers 105a, 105b, 105c via the diaphragm 109. If the actuators 111a, 111b, 111c shrink, ink is supplied to the ink chambers 105a, 105b, 105c. In contrast, if the actuators 111a, 111b, 111c expand, ink is sprayed from the ink chambers 105a, 105b, 105c.

Uniforming brightness of the luminescent layer material across a display area is cited as one of characteristics required for the flat display. In a case where ink is sprayed on the substrate by means of the ink jet application device, in order to uniform the brightness of the luminescent layer material, it is necessary to substantially uniform a shape of the ink across the display area after drying. Therefore, a volume of an ink-droplet is precisely controlled in each pixel of the flat display.

However, in a case where there are variations of an actuator characteristic, a nozzle shape and a volume of an ink-droplet, even if voltages applied to the actuators 111a, 111b, 111c are equal to one another, the volume of the ink-droplet sprayed by the nozzles 103a, 103b, 103c is not uniformed (see FIG. 2). It is here noted that the variation of the volume of the ink-droplet is generated by an air bubble or invaded dust in the ink chamber.

In order to solve the above-described problem, as shown in FIG. 3, specific voltages are supplied to the actuators 111a, 111b, 111c via a switching circuit 115 by dividing a power supply voltage from a voltage supply (not shown) with a resistance dividing circuit 113 consisting of a variable resistance VR1 and a fixed resistance R1, on the basis of a spray signal from a spray order portion 117. An operator manually adjusts the variable resistance VR1 while measuring a volume of an ink-droplet with his/her eye.

When the number of nozzles is small, the operator can easily control the volume of the ink-droplet by adjusting the variable resistance VR1 manually. However, when the number of nozzles is larger, it takes a lot of time and trouble to control the volume of the ink-droplet by adjusting the variable resistance VR1 manually. In fact, when three application heads each having 64 nozzles are mounted in an ink jet application device and then a volume of an ink-droplet is controlled, it takes hours to control the volume of the ink-droplet while it takes a few minutes to apply ink on a substrate.

Further, since the variable resistance VR1 is manually adjusted, a variation of a volume of an ink-droplet is easily generated. This makes it more difficult to stably remain quality of a flat display.

SUMMARY OF THE INVENTION

An object of the present invention is to provide an ink jet application device and an ink jet application method for automatically controlling a volume of an ink-droplet so as to improve operating efficiency and productivity and to reduce a product price.

Another object of the present invention is to provide an ink jet application device and an ink jet application method for substantially uniforming a volume of an ink-droplet so as to manufacture a high quality display.

In order to achieve the above object, the present invention provides an ink jet application device comprising: an application head having a plurality of nozzles and a plurality of actuators respectively mounted to the nozzles, and spraying ink from a nozzle by applying a certain voltage to an actuator; an information storage storing characteristic information for relating a volume of an ink-droplet to a voltage value to be applied to the actuator; a voltage calculation unit connected to the information storage, and calculating a voltage value related to the volume of the ink-droplet sprayed from the nozzle which is a voltage correcting object with reference to the characteristic information; a voltage difference calculation unit connected to the information storage and the voltage calculation unit, and calculating a voltage difference value between the calculated voltage value and a voltage value related to a specific volume of the ink-droplet; and a supply unit connected to the voltage difference calculation unit, and supplying a correction voltage obtained by adding the certain voltage to the voltage difference value to the actuator mounted to the nozzle which is the voltage correcting object.

According to the present invention, even if a volume of the ink-droplet sprayed on the substrate varies, the ink jet application device 1 can automatically correct a voltage value to be applied to the actuator and then supply the voltage value related to the specific volume of the ink-droplet. As a result, operating efficiency and productivity are improved and a product price is reduced because the volume of the ink-droplet is automatically controlled. Also, a high quality display can be manufactured because the volume of the ink-droplet is uniformed in each pixel of the flat display.

In order to achieve the above object, the present invention provides an ink jet application device comprising: an application head having a plurality of nozzles and a plurality of actuators respectively mounted to the nozzles, and spraying ink from a nozzle by applying a certain voltage to an actuator; an information storage storing characteristic information for relating a volume of an ink-droplet to a voltage value to be applied to the actuator and setting information for relating a voltage value to be applied to the actuator to a DA setting value; a voltage calculation unit connected to the information storage, and calculating a voltage value related to the volume of the ink-droplet sprayed from the nozzle which is a voltage correcting object with reference to the characteristic information; a voltage difference calculation unit connected to the information storage and the voltage calculation unit, and calculating a voltage difference value between the calculated voltage value and a voltage value related to a specific volume of the ink-droplet; a converter connected to the information storage and the voltage difference calculation unit, and converting the voltage difference value into a DA setting value with reference to the setting information; an analog signal generator connected to the converter, and converting the DA setting value into an analog signal; a correction voltage generator connected to the analog signal generator, and generating as an output voltage an analog signal corresponding to a correction voltage obtained by adding the certain voltage to the voltage difference value when the analog signal is input thereto; and a supply unit connected to the correction voltage generator, and supplying the output voltage to the actuator mounted to the nozzle which is the voltage correcting object.

According to the present invention, even if a volume of the ink-droplet sprayed on the substrate varies, the ink jet application device 1 can automatically correct a voltage value to be applied to the actuator and then supply the voltage value related to the specific volume of the ink-droplet. As a result, operating efficiency and productivity are improved and a product price is reduced because the volume of the ink-droplet is automatically controlled. Also, a high quality display can be manufactured because the volume of the ink-droplet is uniformed in each pixel of the flat display.

In order to achieve the above object, the present invention provides an ink jet application method employed in an ink jet application device configured to apply a certain voltage to an actuator mounted to a nozzle and spray an ink-droplet from the nozzle by a uniform volume, comprising steps of: reading characteristic information for relating a volume of the ink-droplet to a voltage value to be applied to the actuator; calculating a voltage value related to the volume of the ink-droplet sprayed from the nozzle which is a voltage correcting object with reference to the characteristic information; calculating a voltage difference value between the calculated voltage value and a voltage value related to a specific volume of the ink-droplet; and supplying a correction voltage obtained by adding the specific voltage to the voltage difference value to the actuator mounted to the nozzle which is the voltage correcting object.

According to the present invention, the voltage applied to the actuator is sequentially corrected so at to take a voltage value corresponding to a specific volume of the ink-droplet. Therefore, ink is always sprayed from the nozzle on the substrate by the specific volume of the ink-droplet.

In order to achieve the above object, the present invention provides an ink jet application method employed in an ink jet application device configured to apply a certain voltage to an actuator mounted to a nozzle and spray an ink-droplet from the nozzle by a uniform volume, comprising steps of: reading characteristic information for relating a volume of the ink-droplet to a voltage value to be applied to the actuator; calculating a voltage value related to the volume of the ink-droplet sprayed from the nozzle which is a voltage correcting object with reference to the characteristic information; calculating a voltage difference value between the calculated voltage value and a voltage value related to a specific volume of the ink-droplet; reading setting information for relating the voltage value to be applied to the actuator to a DA setting value; converting the voltage difference value into a DA setting value with reference to the setting information; converting the DA setting value into an analog signal; inputting the analog signal into a reference voltage of a three-terminal regulator; generating as an output voltage an analog signal corresponding to a correction voltage obtained by adding the specific voltage to the voltage difference value in the three-terminal regulator; and supplying the output voltage to the actuator mounted to the nozzle which is the voltage correcting object.

According to the present invention, the voltage applied to the actuator is sequentially corrected so at to take a voltage value corresponding to a specific volume of the ink-droplet. Therefore, ink is always sprayed from the nozzle on the substrate by the specific volume of the ink-droplet.

BRIEF DESCRIPTION OF THE DRAWINGS

FIG. 9 is a flowchart of an ink jet application method according to the embodiment of the present invention.

DESCRIPTION OF THE PREFFERED EMBODIMENT

In reference with FIGS. 4 to 10, an embodiment of the present invention will be described. Here, an X axis, a Y axis and a Z axis are defined as a longitudinal direction, a width direction and a height direction of an ink jet application device, respectively. The X axis, the Y axis and the Z axis are orthogonal to one another.

Figure 1:
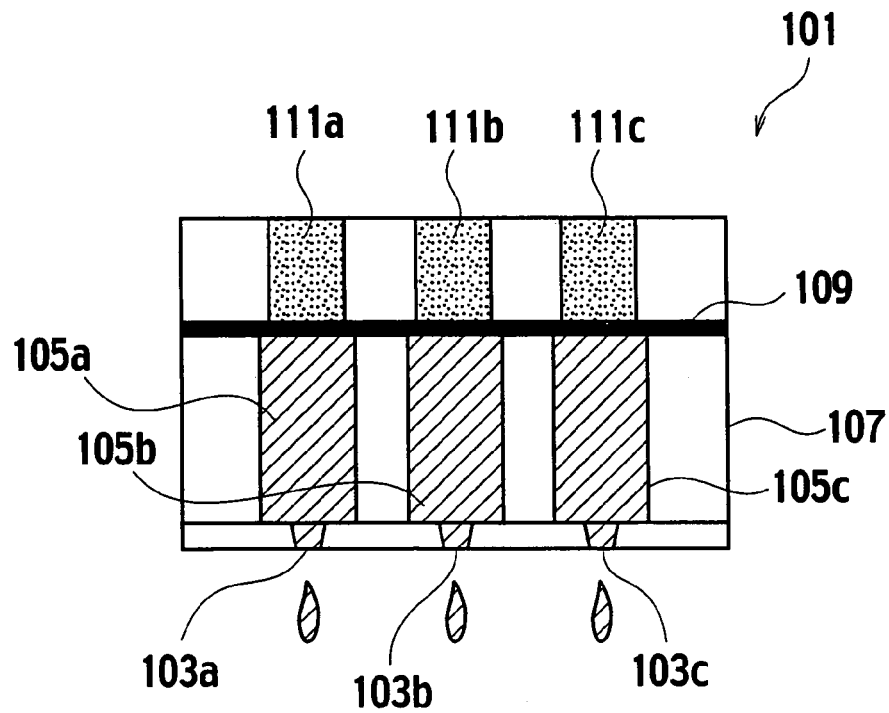
FIG. 1 is a view showing a frame format of a conventional application head.
Figure 2:
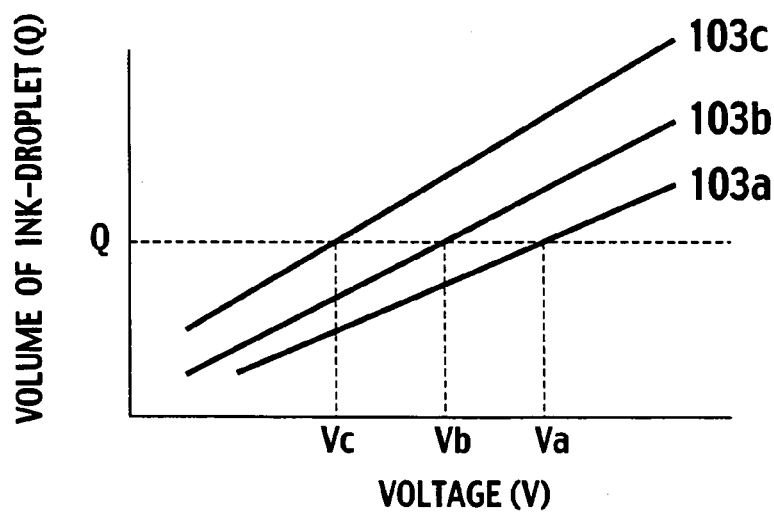
FIG. 2 is a view showing a relation between an applied voltage value and a volume of an ink-droplet in the conventional application head.
Figure 3:
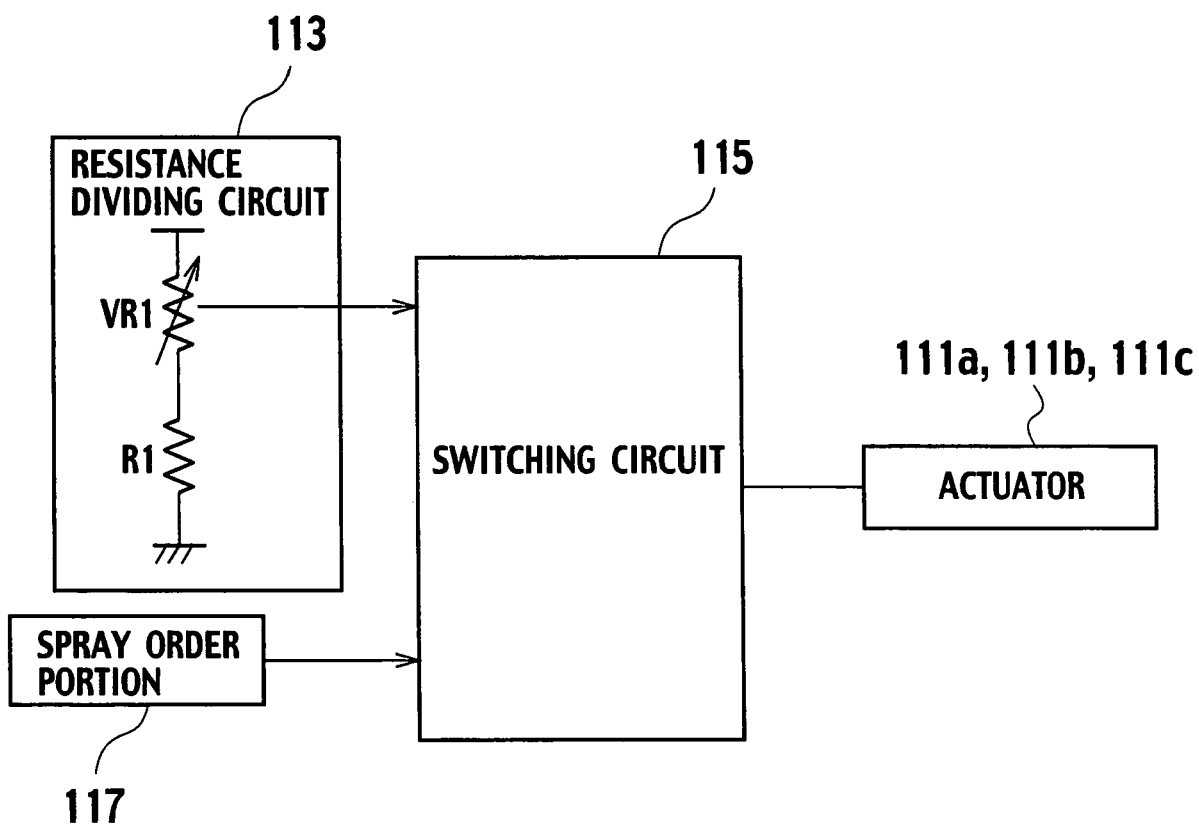
FIG. 3 is a block diagram showing a conventional voltage control unit.
Figure 4:
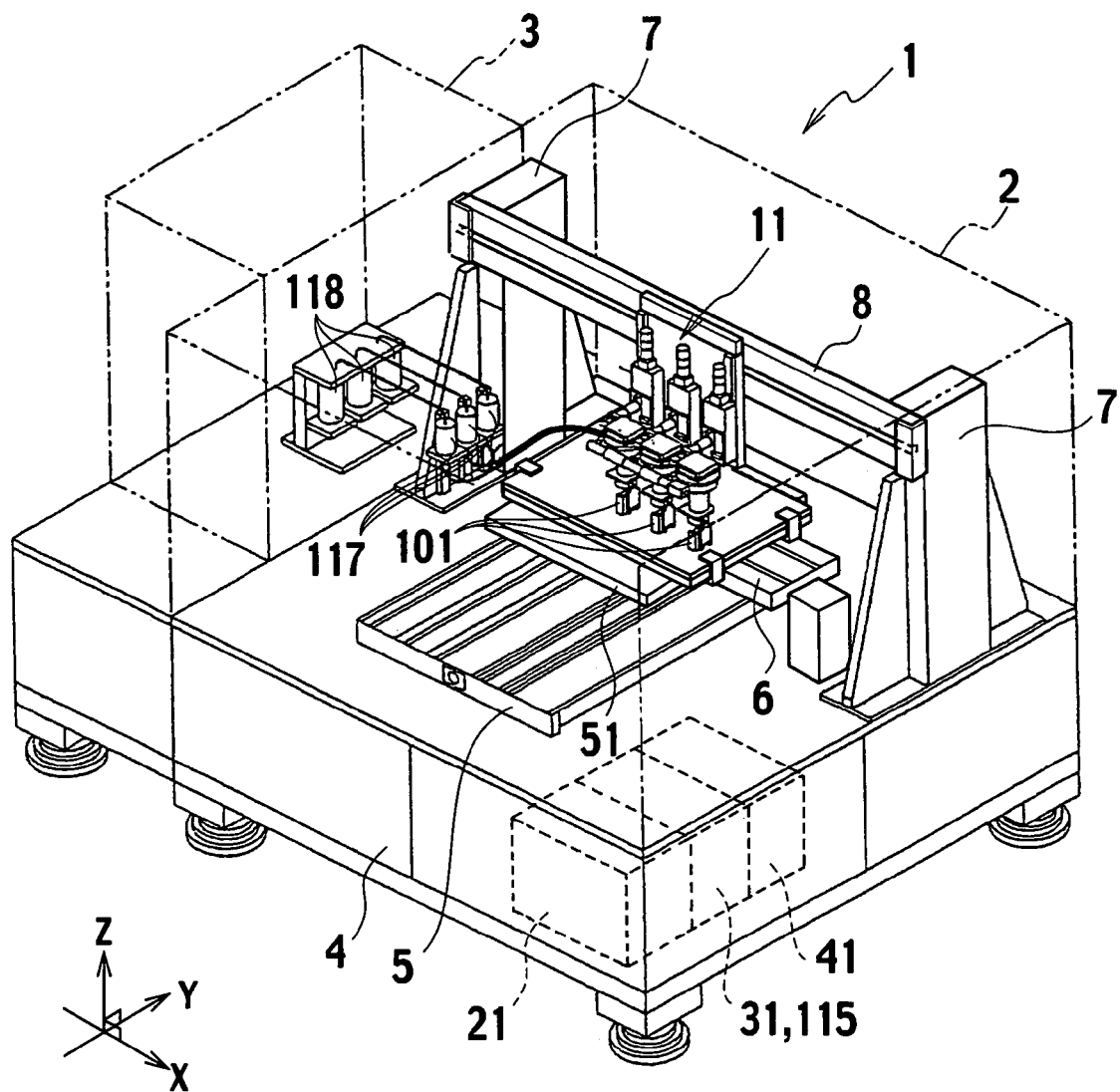
FIG. 4 is a perspective view of an ink jet application device according to an embodiment of the present invention.

As shown in FIG. 4, an ink jet application device 1 comprises an ink application box 2, an ink supply box 3, a mounting 4, a Y axis direction moving table 5, an X axis direction moving table 6, a pair of columns 7, 7, a slide plate 8, an application head unit 11, a table controller 21, a voltage control unit 31, a spray order portion 41 and a switching circuit 115.

The ink application box 2 and the ink supply box 3 are fixed on an upper surface of the mounting 4 so as to be adjacent each other. The Y axis direction moving table 5, the X axis direction moving table 6, the columns 7, 7, the slide plate 8 and the application head unit 11 are arranged in the ink application box 2.

The Y axis direction moving table 5 is fixed on the upper surface of the mounting 4. The X axis direction moving table 6 is placed on an upper surface of the Y axis direction moving table 5. The Y axis direction moving table 5 moves the X axis direction moving table 6 in the Y axis direction on the basis of an order from the table controller 21. A substrate 51 is placed on an upper surface of the X axis direction moving table 6. The X axis direction moving table 6 moves the substrate 51 in the X axis direction on the basis of an order from the table controller 21.

The columns 7, 7 are installed on the upper surface of the mounting 4 in a standing manner so as to be opposed to each other at both sides (±X sides) of the Y axis direction moving table 5, the X axis direction moving table 6 and the substrate 51. The slide plate 8 is laid horizontally between top ends of the columns 7, 7. The application head unit 11 is installed so as to hang from the slide plate 8 and slides in the X axis direction on the basis of an order from the table controller 21. The application head unit 11 has application heads 101, 101, 101 at a lower end (−Z side) thereof. It is here noted that the number of the application heads is not limited to three.

The table controller 21 is arranged in the mounting 4 and controls the X axis direction moving table 5, the Y axis direction moving table 6 and the application head unit 11.

The voltage control unit 31 is arranged in the mounting 4. The voltage control unit 31 corrects voltage values applied to actuators 111a, 111b, 111c of each application head 101 and then controls a volume of an ink-droplet to be sprayed on a desired area (pixel or cell) of the substrate 51.

The spray order portion 41 is arranged in the mounting 4. The spray order portion 41 applies voltages from the voltage control unit 31 to the actuators 111a, 111b, 111c via a spray order signal, which allows each application head 101 to spray ink on the desired area (pixel or cell) of the substrate 51. Further, the spray order portion 41 adjusts time intervals at which the voltages from the voltage control unit 31 are applied to the actuators 111a, 111b, 111c, which controls the timing of spraying the ink on the desired area (pixel or cell) of the substrate 51.

Figure 5:
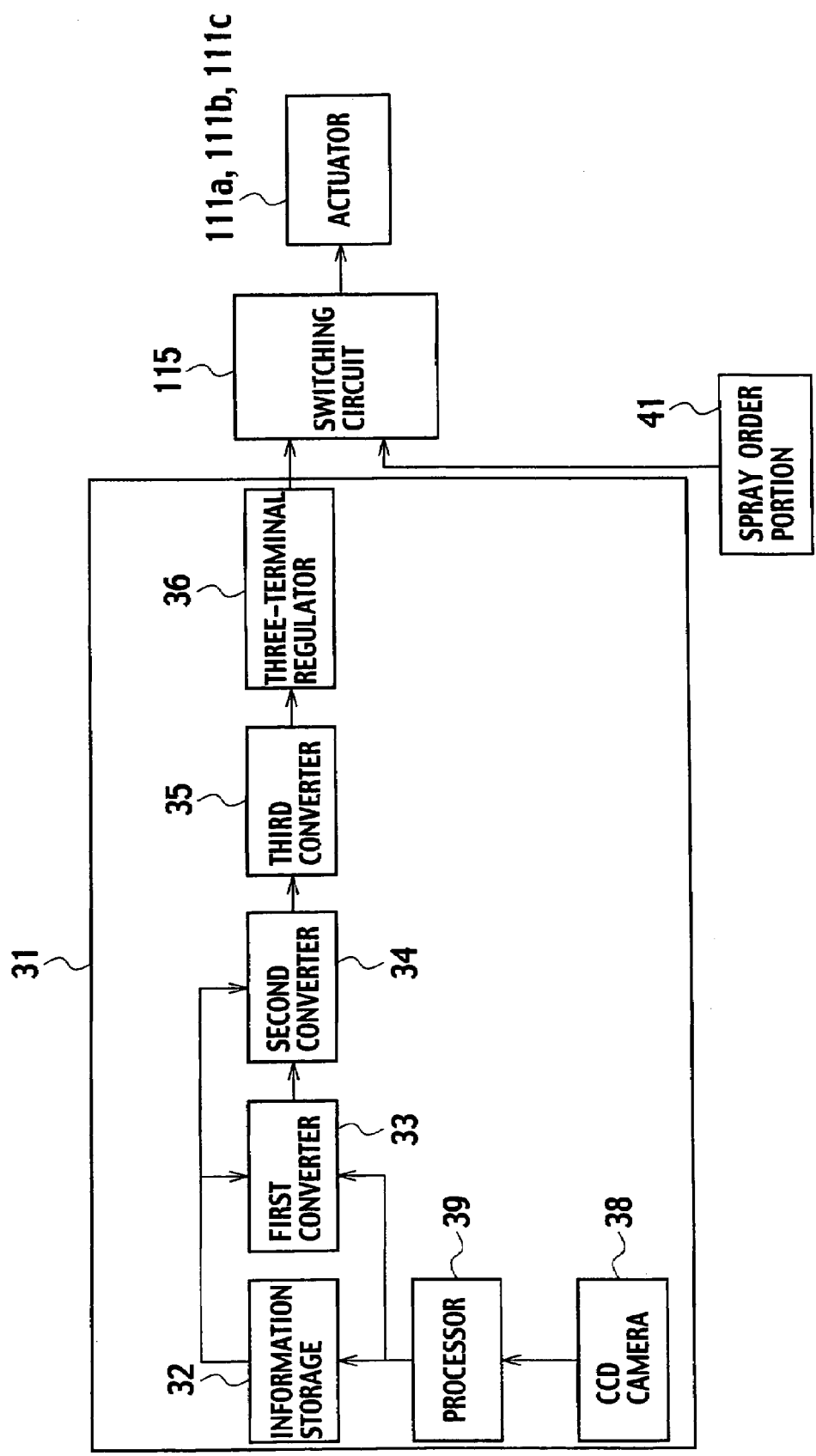
FIG. 5 is a block diagram showing a voltage control unit according to the embodiment of the present invention.
Figure 6:
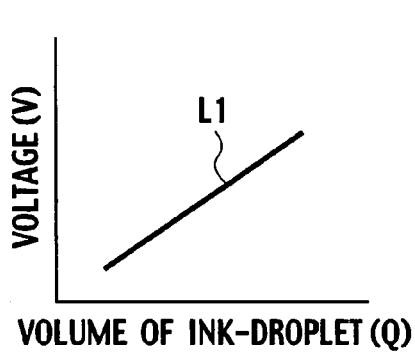
FIG. 6 is a view showing a relation (characteristic information) between an applied voltage value and a volume of an ink-droplet in an application head according to the embodiment of the present invention.
Figure 7:
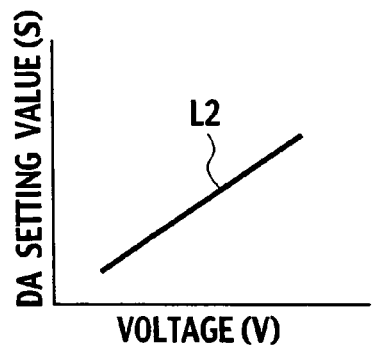
FIG. 7 is a view showing a relation (setting information) between a DA setting value and an applied voltage value according to the embodiment of the present invention.

As shown in FIG. 5, the voltage control unit 31 comprises an information storage 32, a first converter 33, a second converter 34, a third converter 35, a three-terminal regulator 36, a CCD camera 38 and a processor 39. The third converter 35 and the three-terminal regulator 36 are incorporated into a variable power supply (not shown). Here, the first converter 33 and the second converter 34 may be incorporated into the table controller 21 or the spray order portion 41.

The information storage 32 is a memory storage (HD, ROM, etc.) that preliminarily stores a specific volume of an ink-droplet, conversion information, characteristic information and setting information. The specific volume $Q_{const}$ of the ink-droplet is a best volume of the ink-droplet for applying ink on the substrate 51. The conversion information is information for relating a sprayed ink diameter to a volume of the ink-droplet. The characteristic information is information for relating a volume of the ink-droplet to a voltage value to be applied to the actuator. The setting information is information for relating a voltage value to a DA setting value (for example, an 8 or 16-bit digital signal value). An applied voltage value V has a substantial linear relationship with a volume Q of the ink-droplet (see FIG. 6). Also, the applied voltage value V has a substantial linear relationship with a DA setting value S (see FIG. 7).

The first converter 33 is connected to the information storage 32 and the processor 39. The first converter 33 calculates a volume Q of the ink-droplet from a sprayed ink diameter and then converts the volume Q of the ink-droplet into an applied voltage value V.

Figure 8:
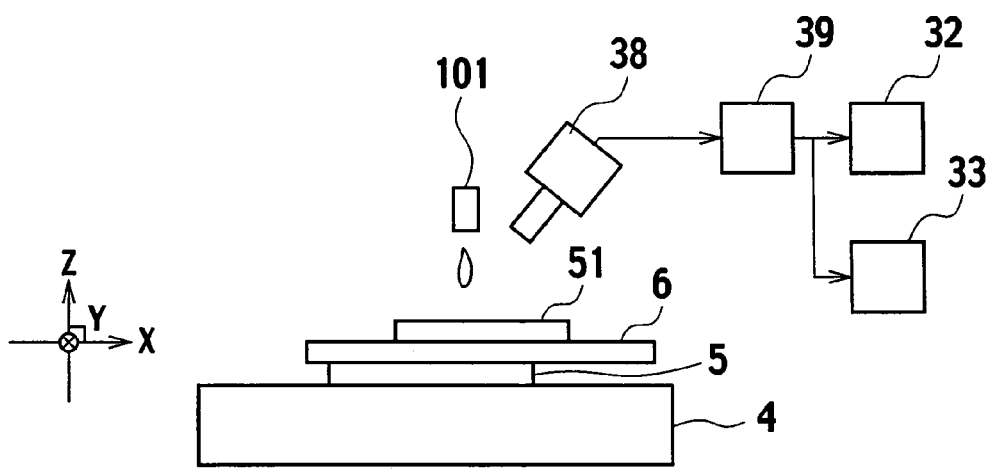
FIG. 8 is a schematic cross-section view of the ink jet application device according to the embodiment of the present invention.

As shown in FIG. 8, the CCD camera 38 images ink applied on the substrate 51 and then sends the ink image to the processor 39. The processor 39 processes the ink image to calculate a sprayed ink diameter. The first converter 33 calculates a volume Q of the ink-droplet from the sprayed ink diameter sent from the processor 39, with reference to the conversion information. Then, the first converter 33 converts the volume Q of the ink-droplet into an applied voltage value V, with reference to the characteristic information. More specifically, the first converter 33 multiplies the volume Q of the ink-droplet by a variation (the slop of the line L1) of the characteristic information to obtain the applied voltage value V. Further, the first converter 33 obtains a specific voltage value $V_{const}$ related to the specific volume $Q_{const}$ of the ink-droplet and then calculates a voltage difference value $\Delta V$ ($=V-V_{const}$) which is a difference value between the applied voltage value V and the specific voltage value $V_{const}$. In a case where the voltage difference value $\Delta V$ is "0", the voltage control unit 31 does not correct a voltage to be applied to the actuator because the first converter 33 does not send the voltage difference value $\Delta V$ to the second converter 34.

The second converter 34 is connected to the information storage 32 and the first converter 33. The second converter 34 converts the voltage difference value $\Delta V$ sent from the first converter 33 into a DA setting value S, with reference to the setting information. More specifically, the second converter 34 multiplies the voltage difference value $\Delta V$ by a variation (the slop of the line L2) of the setting information to obtain the DA setting value S.

The third converter 35 is connected to the second converter 34. The third converter 35 is a DA converter for converting the DA setting value S sent from the second converter 34 into an analog signal. In order to realize automation of the ink jet application device 1, information is processed with a digital signal in the first converter 33, the second converter 34 and the processor 39 and with an analog signal in the three-terminal regulator 36. Therefore, the third converter 35 converts the digital signal into the analog signal.

In a case where the third converter 35 is incompatible with the first converter 33, it is necessary to provide the second converter 34 between the first converter 33 and the third converter 35 and then convert the voltage difference value $\Delta V$ into a voltage belonging to a range of use of the three-terminal regulator 36. In this embodiment, the second converter 34 converts the voltage difference value $\Delta V$ sent from the first converter 33 into the voltage (DA setting value S) belonging to the range of use of the three-terminal regulator 36.

The three-terminal regulator 36 is connected to the third converter 35 and the switching circuit 37. The three-terminal regulator 36 obtains the analog signal sent from the third converter 35 as a reference voltage. The three-terminal regulator 36 supplies a correction voltage value (output voltage value) $V_{corr}$ ($=V_{const}=V+\Delta V$) to the switching circuit 115 on the basis of the reference voltage.

The correction voltage value $V_{corr}$ is supplied to the actuator 111a (111b or 111c) via the switching circuit 115 on the basis of the spray order signal from the spray order portion 41.

Next, advantage features of the ink jet application device 1 will be described.

The first converter 33 automatically calculates a volume Q of the ink-droplet from the sprayed ink diameter calculated by the processor 39 with reference to the conversion information. Therefore, the volume of the ink-droplet is easily and precisely calculated in comparison with a conventional method for measuring a volume of the ink-droplet with an operator's eye.

A volume of the ink-droplet related to an applied voltage value (characteristic information) for each nozzle is preliminarily stored. In fact, when ink is sprayed on the substrate, a volume of the ink-droplet is calculated from the sprayed ink diameter and then an applied voltage value related to the calculated volume of the ink-droplet is obtained on the basis of the characteristics information. Further, a specific voltage value related to the specific volume of the ink-droplet is obtained and then a voltage difference value is calculated from the applied voltage value and the specific voltage value. Then, the voltage difference value is converted into a DA setting value and then input into the three-terminal regulator as a reference voltage. Finally, a correction voltage value is generated by the three-terminal regulator and then supplied to the actuator via the switching circuit.

Therefore, even if a volume of the ink-droplet sprayed on the substrate varies, the ink jet application device 1 can automatically correct a voltage value to be applied to the actuator and then supply the specific voltage value related to the specific volume of the ink-droplet. As a result, operating efficiency and productivity are improved and a product price is reduced because the volume of the ink-droplet is automatically controlled. Also, a high quality display can be manufactured because the volume of the ink-droplet is uniformed in each pixel of the flat display.

Next, an ink jet application method will be described (see FIG. 9).

Figure 10:
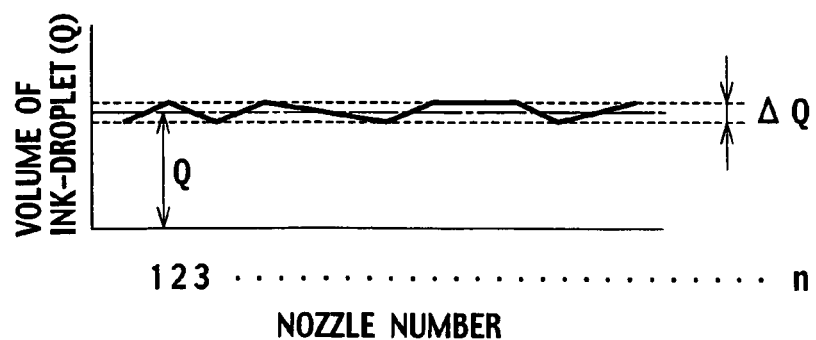
FIG. 10 is a view showing a volume of an ink-droplet of each nozzle mounted in the application head according to the embodiment of the present invention.

Firstly, the characteristic information of each nozzle is obtained and then stored in the information storage 32 (step S1). As shown in FIG. 10, even if a certain voltage is applied to a plurality of nozzles, volumes Q fluctuate in the range of $\Delta Q$ because a volume Q of the ink-droplet of one nozzle differs from that of another nozzle due to variations of an actuator characteristic, a nozzle characteristic, etc.

More specifically, the spray order portion 41 applies a voltage to the actuator via the spray signal, which sprays ink from a nozzle being a measuring object on a test substrate 51 placed on the upper surface of the X axis direction moving table 6. The CCD camera 38 images the ink sprayed on the test substrate 51 and then sends the ink image to the processor 39. The processor 39 processes the ink image to calculate a sprayed ink diameter. Then, the processor 39 calculates a volume Q of the ink-droplet from the sprayed ink diameter with reference to the conversion information. The information storage 32 relates the applied voltage value V sent from the processor 39 to the calculated volume Q of the ink-droplet and then stores them in a database as characteristic information. This measuring operation is repeated predetermined times while moving the test substrates 51 by means of the table controller 21 and increasing a voltage to be applied to the actuators in stages. The measuring operation is carried out with respect to all nozzles.

Next, The substrate 51 is adsorbed and fixed to the upper surface of the X axis direction moving table 6 (step S2). The table controller 21 controls the Y axis direction moving table 5 or the X axis direction moving table 6 to move the substrate 51 in a desired direction at a certain speed (step S3). The spray order portion 41 applies a voltage to the actuator via the spray signal, which sprays ink from a nozzle on the substrate 51 (step S4). The CCD camera 38 images the ink sprayed on the substrate 51 and then sends the ink image to the processor 39 (step S5). The processor 39 processes the ink image and then calculates a sprayed ink diameter (step S6).

The first converter 33 reads the conversion information from the information storage 32 and then calculates a volume Q of the ink-droplet from the sprayed ink diameter sent from the processor 39 (step S7). Then, the first converter 33 reads the characteristic information from the information storage 32 and converts the calculated volume Q of the ink-droplet into a voltage value V applied to the actuator (step S8). Further, the first converter 33 obtains the specific voltage $V_{const}$ related to the specific volume $Q_{const}$ of the ink-droplet and then calculates a voltage difference value $\Delta V$ ($=V-V_{const}$) which is a difference value between the applied voltage value V and the specific voltage value $V_{const}$ (step S9). The first converter 33 determines whether or not the voltage difference value $\Delta V$ is "0" (step S10). If the voltage difference value $\Delta V$ is "0", the first converter 33 returns to step S4. If the voltage difference value $\Delta V$ is not "0", the first converter 33 goes to step S11.

The second converter 34 reads the setting information from the information storage 32 and then converts the voltage difference value $\Delta V$ sent from the first converter 33 into a DA setting value S (step S11). The third converter 35 converts the DA setting value S sent from the second converter 34 into an analog signal (step S12). The three-terminal regulator 36 obtains the analog signal sent from the third converter 35 as a reference voltage and then generates a correction voltage value (output voltage value) $V_{corr}$ ($=V_{const}=V+\Delta V$) (step S13).

The switching circuit 115 supplies the correction voltage value $V_{corr}$ sent from the three-terminal regulator 36 to the actuator 111a (111b or 111c) on the basis of the spray signal sent from the spray order portion 41 (step S14). The spray order portion 41 determines whether or not this ink spray is finished (step S15). If the ink spray is not finished, this process returns to step S5.

If a voltage signal (pulse signal) from the switching circuit 115 becomes ON, the actuator 111a (111b or 111c) charges and then expands. Thereby, the ink chamber 105a (105b or 105c) is compressed to spray an ink-droplet having a desired volume on the substrate 51. If the voltage signal (pulse signal) from the switching circuit 115 becomes OFF, the actuator 111a (111b or 111c) discharges and then stops spraying ink on the substrate 51.

Setting and moving methods of the substrate 51 will be described in detail in step S2 and S3.

In step S2, the substrate 51 is adsorbed and fixed to the upper surface of the X axis direction moving table 6 such that the nozzle is opposed to an end portion (−Y side or +Y side) of the substrate 51. In step S3, the table controller 21 controls the X axis direction moving table 6 to move the substrate 51 along the X axis at the certain speed. When application of ink for a first line of the substrate 51 is finished, the table controller 21 controls the Y axis direction moving table 5 to move the X axis direction moving table 6 in the +Y direction (or −Y direction) by a distance equal to the applied ink diameter. Then, the table controller 21 controls the X axis direction moving table 6 to move the substrate 51 along the X axis at the certain speed. Therefore, ink is applied on the substrate 51 in a reticular pattern.

Next, advantage features of the ink jet application method will be described.

The applied ink is imaged by the CCD camera 38 and then the ink image is processed by the processor 39. The voltage control unit 31 measures a volume Q of the ink-droplet and then sequentially corrects a voltage to be applied to the actuator. Therefore, ink is always sprayed from the nozzle 103a (103b or 103) on the substrate 51 by the specific volume $Q_{const}$ of the ink-droplet.

Next, a modification of the ink jet application device 1 will be described.

Since a volume of the ink-droplet to be applied gradually decreases due to deterioration of the actuators 111a, 111b and 111c over time, the characteristic information may be periodically updated.

A device for imaging an applied ink diameter is not limited to the CCD camera 38. The device may be another device capable of measuring the applied ink diameter or a volume of the ink-droplet precisely.

What is claimed is:

1. An ink jet application device comprising:
    an application head having a plurality of nozzles and a plurality of actuators respectively mounted to the nozzles, and spraying ink from a nozzle by applying a certain voltage to an actuator;
    an information storage storing characteristic information for relating a volume of an ink-droplet to a voltage value to be applied to the actuator;
    a voltage calculation unit connected to the information storage, and calculating a voltage value related to the volume of the ink-droplet sprayed from the nozzle which is a voltage correcting object with reference to the characteristic information;
    a voltage difference calculation unit connected to the information storage and the voltage calculation unit, and calculating a voltage difference value between the calculated voltage value and a voltage value related to a specific volume of the ink-droplet; and
    a supply unit connected to the voltage difference calculation unit, and supplying a correction voltage obtained by adding the certain voltage to the voltage difference value to the actuator mounted to the nozzle which is the voltage correcting object.

2. An ink jet application device comprising:
    an application head having a plurality of nozzles and a plurality of actuators respectively mounted to the nozzles, and spraying ink from a nozzle by applying a certain voltage to an actuator;
    an information storage storing characteristic information for relating a volume of an ink-droplet to a voltage value to be applied to the actuator and setting information for relating a voltage value to be applied to the actuator to a DA setting value;
    a voltage calculation unit connected to the information storage, and calculating a voltage value related to the volume of the ink-droplet sprayed from the nozzle which is a voltage correcting object with reference to the characteristic information;
    a voltage difference calculation unit connected to the information storage and the voltage calculation unit, and calculating a voltage difference value between the calculated voltage value and a voltage value related to a specific volume of the ink-droplet;
    a converter connected to the information storage and the voltage difference calculation unit, and converting the voltage difference value into a DA setting value with reference to the setting information;
    an analog signal generator connected to the converter, and converting the DA setting value into an analog signal;
    a correction voltage generator connected to the analog signal generator, and generating as an output voltage an analog signal corresponding to a correction voltage obtained by adding the certain voltage to the voltage difference value when the analog signal is input thereto; and
    a supply unit connected to the correction voltage generator, and supplying the output voltage to the actuator mounted to the nozzle which is the voltage correcting object.

3. An ink jet application method employed in an ink jet application device configured to apply a certain voltage to an actuator mounted to a nozzle and spray an ink-droplet from the nozzle by a uniform volume, comprising steps of:
    reading characteristic information for relating a volume of the ink-droplet to a voltage value to be applied to the actuator;
    calculating a voltage value related to the volume of the ink-droplet sprayed from the nozzle which is a voltage correcting object with reference to the characteristic information;
    calculating a voltage difference value between the calculated voltage value and a voltage value related to a specific volume of the ink-droplet; and
    supplying a correction voltage obtained by adding the certain voltage to the voltage difference value to the actuator mounted to the nozzle which is the voltage correcting object.

4. An ink jet application method employed in an ink jet application device configured to apply a certain voltage to an actuator mounted to a nozzle and spray an ink-droplet from the nozzle by a uniform volume, comprising steps of:
    reading characteristic information for relating a volume of the ink-droplet to a voltage value to be applied to the actuator;
    calculating a voltage value related to the volume of the ink-droplet sprayed from the nozzle which is a voltage correcting object with reference to the characteristic information;
    calculating a voltage difference value between the calculated voltage value and a voltage value related to a specific volume of the ink-droplet;
    reading setting information for relating the voltage value to be applied to the actuator to a DA setting value;
    converting the voltage difference value into a DA setting value with reference to the setting information;
    converting the DA setting value into an analog signal;
    inputting the analog signal into a reference voltage of a three-terminal regulator;
    generating as an output voltage an analog signal corresponding to a correction voltage obtained by adding the certain voltage to the voltage difference value in the three-terminal regulator; and
    supplying the output voltage to the actuator mounted to the nozzle which is the voltage correcting object.

* * * * *